United States Patent
Kwon (12)

(10) Patent No.: US 12,427,573 B2
(45) Date of Patent: *Sep. 30, 2025

(54) METHOD FOR MANUFACTURING FUNCTIONALLY GRADED COMPOSITE MATERIAL FOR PCB HAVING HIGH HEAT DISSIPATING PROPERTIES AND ELECTRIC INSULATING PROPERTIES, AND FUNCTIONALLY GRADED COMPOSITE MATERIAL MANUFACTURED THEREBY

(71) Applicant: PUKYONG NATIONAL UNIVERSITY INDUSTRY-UNIVERSITY COOPERATION FOUNDATION, Busan (KR)

(72) Inventor: Hansang Kwon, Busan (KR)

(73) Assignee: Pukyong National University Industry-University Cooperation Foundation, Busan (KR)

( * ) Notice: Subject to any disclaimer, the term of this patent is extended or adjusted under 35 U.S.C. 154(b) by 417 days.

This patent is subject to a terminal disclaimer.

(21) Appl. No.: 17/814,764

(22) Filed: Jul. 25, 2022

(65) Prior Publication Data

US 2022/0355376 A1    Nov. 10, 2022

Related U.S. Application Data

(63) Continuation of application No. PCT/KR2020/006644, filed on May 21, 2020.

(30) Foreign Application Priority Data

Jan. 31, 2020 (KR) .................. 10-2020-0012096

(51) Int. Cl.
  *B22F 7/00* (2006.01)
  *B22F 3/105* (2006.01)
  (Continued)

(52) U.S. Cl.
  CPC .............. *B22F 7/008* (2013.01); *B22F 3/105* (2013.01); *B22F 7/02* (2013.01); *H05K 1/0306* (2013.01);
  (Continued)

(58) Field of Classification Search
  CPC ...... B22F 3/10–1146; B22F 2003/1051; B22F 7/02; B22F 2207/01; B22F 2301/052; B22F 2301/058
  See application file for complete search history.

(56) References Cited

U.S. PATENT DOCUMENTS

| | | | |
|---|---|---|---|
| 11,577,313 B2* | 2/2023 | Kwon | H01R 13/629 |
| 11,592,473 B2* | 2/2023 | Kwon | H01R 13/03 |

(Continued)

FOREIGN PATENT DOCUMENTS

| | | |
|---|---|---|
| JP | H10-264311 A | 10/1998 |
| JP | 2002-309323 A | 10/2002 |

(Continued)

OTHER PUBLICATIONS

JP2002309323A English language translation (Year: 2002).*

(Continued)

*Primary Examiner* — Sally A Merkling
*Assistant Examiner* — Sean P. O'Keefe
(74) *Attorney, Agent, or Firm* — Knobbe, Martens, Olson, & Bear, LLP

(57) ABSTRACT

A method for manufacturing a functionally graded composite material for a printed circuit board (PCB) is proposed. The method may include preparing two or more types of mixed powders with different contents of polymer or ceramic powder, each mixed powder comprising (i) a metal powder comprising a powder made of aluminum or an aluminum alloy and a powder of magnesium and (ii) the polymer or ceramic powder. The method may also include laminating the two or more types of mixed powders to form a functionally graded laminate in which a ratio of the content of the polymer or ceramic powder to the content of the metal powder in each of layers stacked in sequence from bottom to the top of the laminate differs. The method may further include preparing a functionally graded composite material by sintering the functionally graded laminate by pressureless sintering or spark plasma sintering.

3 Claims, 1 Drawing Sheet

(51) Int. Cl.
  *B22F 7/02* (2006.01)
  *H05K 1/03* (2006.01)
(52) U.S. Cl.
  CPC ...... *H05K 1/036* (2013.01); *B22F 2003/1051* (2013.01); *B22F 2202/13* (2013.01); *B22F 2207/01* (2013.01); *B22F 2301/052* (2013.01); *B22F 2301/058* (2013.01); *B22F 2302/45* (2013.01)

(56) References Cited

U.S. PATENT DOCUMENTS

| | | | | |
|---|---|---|---|---|
| 2011/0017501 A1* | 1/2011 | Ohmi | ................ | H01F 1/26 428/323 |
| 2017/0050159 A1* | 2/2017 | Xu | ................ | B01J 2/16 |
| 2020/0308465 A1* | 10/2020 | Zhang | ................ | C08K 5/3417 |

FOREIGN PATENT DOCUMENTS

| | | | | |
|---|---|---|---|---|
| JP | 2003-159756 A | 6/2003 | | |
| KR | 10-2015-0143278 A | 12/2015 | | |
| KR | 10-2016-0144821 A | 12/2016 | | |
| KR | 10-1694528 B1 | 1/2017 | | |
| KR | 1787737 B1 * | 10/2017 | ............ | B22F 3/105 |
| KR | 10-1897668 B1 | 10/2018 | | |
| WO | WO-2014002581 A1 * | 1/2014 | ............ | C08K 5/04 |

OTHER PUBLICATIONS

Park, Kwangjae, Jehong Park, and Hansang Kwon. "Effect of intermetallic compound on the Al—Mg composite materials fabricated by mechanical ball milling and spark plasma sintering." Journal of Alloys and Compounds 739 (2018): 311-318 (Year: 2018).*

International Search Report mailed Dec. 8, 2020 in International Application No. PCT/KR2020/006644.

* cited by examiner

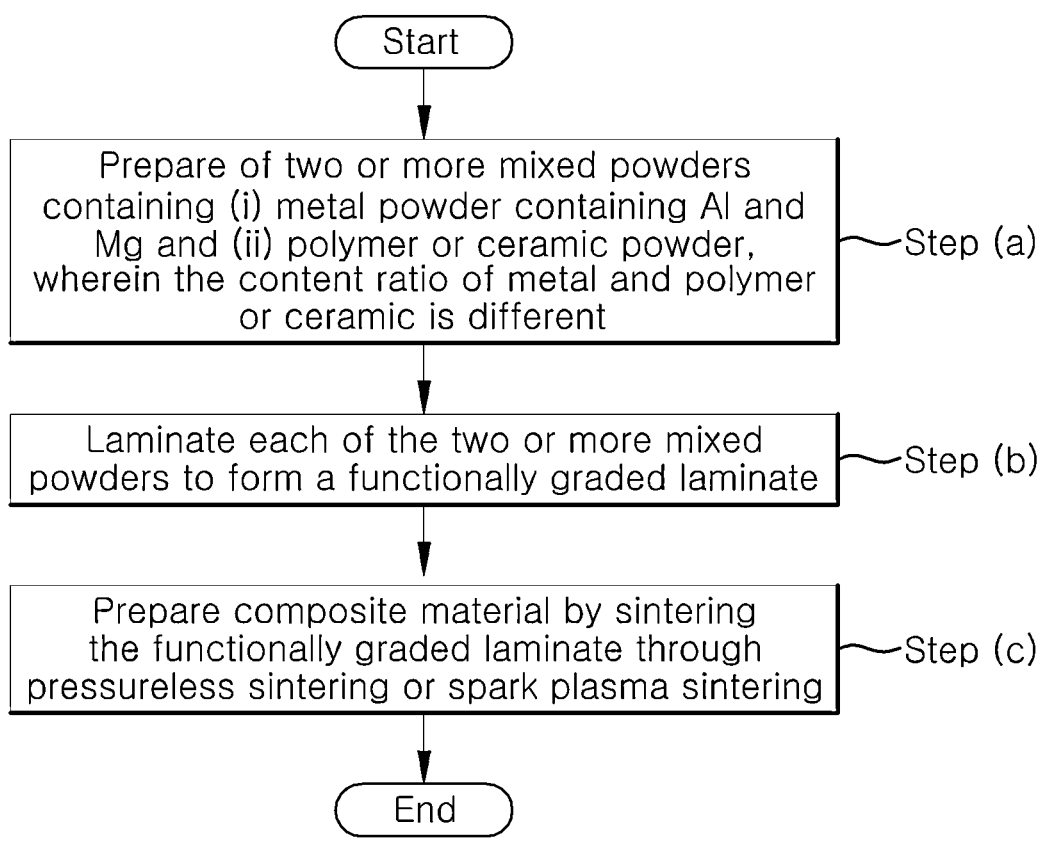

METHOD FOR MANUFACTURING FUNCTIONALLY GRADED COMPOSITE MATERIAL FOR PCB HAVING HIGH HEAT DISSIPATING PROPERTIES AND ELECTRIC INSULATING PROPERTIES, AND FUNCTIONALLY GRADED COMPOSITE MATERIAL MANUFACTURED THEREBY

CROSS-REFERENCE TO RELATED APPLICATIONS

This application is a continuation application, and claims the benefit under 35 U.S.C. § 120 and § 365 of PCT Application No. PCT/KR2020/006644 filed on May 21, 2020, which claims priority to Korean Patent Application No. 10-2020-0012096 filed on Jan. 31, 2020, both of which are hereby incorporated by reference in their entirety.

BACKGROUND

The present disclosure relates to a method for manufacturing a composite material with high thermal conductivity and electrically insulating nature so as to be usefully used as a material for a printed circuit board (PCB) and to a composite material manufactured thereby.

SUMMARY

One aspect is a method for manufacturing a composite material for a PCB, which has high heat dissipation and electrical insulation at the same time and has improved performance and quality compared to a conventional polymer-based PCB, and a composite material for a PCB manufactured thereby.

Another aspect is a method of manufacturing a functionally graded composite material for a PCB which includes: (a) preparing two or more types of mixed powders with different contents of polymer or ceramic powder, each mixed powder comprising (i) a metal powder comprising a powder made of aluminum or an aluminum alloy and a powder of magnesium and (ii) the polymer or ceramic powder; (b) laminating the two or more types of mixed powders prepared in step (a) to form a functionally graded laminate in which a ratio of the content of the polymer or ceramic powder to the content of the metal powder in each of layers stacked in sequence from bottom to the top of the laminate differs; and (c) preparing a functionally graded composite material by sintering the functionally graded laminate by pressureless sintering or spark plasma sintering.

In addition, the mixed powder may include (i) 30 to 85% by volume of metal powder including powder made of aluminum or aluminum alloy and magnesium powder, and (ii) 15 to 70% by volume of polymer or ceramic powder.

In addition, in the functionally graded laminate, the polymer or ceramic powder content fraction of the metal powder content of each layer increases from the lowermost layer toward the uppermost layer.[0009] In addition, in the functionally graded laminate, the polymer or ceramic powder content fraction of each layer decreases from the lowermost layer toward the uppermost layer.

In addition, the ceramic powder consists of at least one selected from the group consisting of MgO, $SiO_2$, $Al_2O_3$, AlN, and $Si_3N_4$.

In addition, the polymer powder is made of polyarylate (PAR).

Furthermore, the present disclosure proposes a functionally graded composite material for PCB manufactured by the above manufacturing method.

In addition, the functionally graded composite material for PCB has a sheet shape, and the volume fraction of the polymer or ceramic continuously changes from one side to the other in at least one of the thickness, length, and width directions of the sheet.

According to the method for manufacturing a functionally graded composite material for PCB, according to the present disclosure, a functionally graded laminate is formed by laminating a metal powder including aluminum and magnesium and a mixed powder including an electrically insulating polymer and/or ceramic powder. Thereafter, a heterogeneous functionally graded composite material is manufactured through a sintering process using a powder metallurgical method such as pressureless sintering and spark plasma sintering. Accordingly, a material for a PCB having high heat dissipation and electrical insulation at the same time can be obtained by the excellent thermal conductivity of a metal base and the electrical shielding ability by introducing insulating particles.

In addition, according to the present disclosure, a process for raising an insulating layer required for manufacturing a metal-based PCB according to the related art may be excluded, and a problem of thermal conductivity degradation of a PCB caused by the process for manufacturing an insulating layer may be solved. Therefore, it can be applied as a material for various substrates.

BRIEF DESCRIPTION OF THE DRAWINGS

FIG. 1 is a process flow diagram of a method for manufacturing a functionally graded composite material for a PCB according to the present disclosure.

DETAILED DESCRIPTION

Polymer-based PCBs have been generally used in various industrial electricity, electronics, machinery, etc., but recently, as technology advances, the demand for metal-based PCBs with better heat dissipation and durability than polymer-based PCBs has increased. This phenomenon is expected to intensify with the application of high-capacity semiconductors.

Although it is true that the metal-based PCB is better in heat dissipation and durability than the polymer-based PCB, an insulating layer manufacturing process is additionally required, and thermal conductivity is degraded due to the insulating layer manufacturing process.

Therefore, it is still necessary to develop a material for a PCB having better performance than a conventional metal-based PCB.

In describing the present disclosure, when it is determined that a detailed description of related known functions or configurations may unnecessarily obscure the gist of the present disclosure, the detailed description thereof will be omitted.

Since the embodiment, according to the concept of the present disclosure, may have various changes and may have various forms, specific embodiments will be illustrated in the drawings and described in detail in the present specification or application. However, this is not intended to limit the embodiment according to the concept of the present disclosure to a specific disclosed form and should be understood to include all changes, equivalents, or substitutes included in the spirit and scope of the present disclosure.

The terms used herein are used only to describe specific embodiments and are not intended to limit the present disclosure. The singular expression includes the plural expression unless the context clearly dictates otherwise. In this specification, the term "include" or "have" should be understood to designate that one or more of the described features, numbers, steps, operations, components, or a combination thereof exist, and the possibility of addition of one or more other features or numbers, operations, components, or combinations thereof should not be excluded in advance.

Hereinafter, the present disclosure will be described in detail.

The present disclosure relates to a method for manufacturing a functionally graded composite material having each layer including a metal base and temperature insulating polymer or ceramic particles, as a novel material having high heat dissipation and electrical insulation at the same time compared to a conventional polymer or metal-based PCB.

Here, a functionally graded material: (FGM) can be defined as 'a material whose microstructure, composition, etc., changes gradually depending on the location of the material so as to be functionally suitable for a specific purpose to be used'.

In order to manufacture a functionally graded material, a compositional gradient is required in the thickness direction of the material, and to this end, a volume fraction of each material in the mixed coating layer needs to be changed at the desired ratio. In this disclosure, two or more types of mixed powders, including metal powder and electrically insulating material powder (polymer or ceramic powder) and having different content fractions of electrically insulating material powder to metal powder, are prepared, and each mixed powder is laminated and sintered to prepare a functionally graded material.

More specifically, the present disclosure proposes a method of manufacturing a functionally graded composite material for a PCB. The present disclosure includes: (a) preparing two or more types of mixed powders with different contents of polymer or ceramic powder, each mixed powder comprising (i) a metal powder comprising a powder made of aluminum or an aluminum alloy and a powder of magnesium and (ii) the polymer or ceramic powder; (b) laminating the two or more types of mixed powders prepared in step (a) to form a functionally graded laminate in which a ratio of the content of the polymer or ceramic powder to the content of the metal powder in each of layers stacked in sequence from bottom to the top of the laminate differs; and (c) preparing a functionally graded composite material by sintering the functionally graded laminate by pressureless sintering or spark plasma sintering (FIG. 1).

In step (a), at least two homogeneous mixed powders having different polymer or ceramic powder content fractions are prepared using metal powders, including aluminum, magnesium, and the like, and ceramic powders added to impart electrical insulation to the composite materials through various types of ball milling processes such as electric ball milling, stirring ball milling, and planetary ball milling. For example, a low-energy milling process using a conventional electric ball milling apparatus may be performed at 100 to 500 rpm for 1 to 24 hours to prepare a mixed powder.

At this time, the aluminum alloy contained in the metal powder may be one or more aluminum alloys selected from the group consisting of 1000 series, 2000 series, 3000 series, 4000 series, 5000 series, 6000 series, 7000 series, and 8000 series.

The ceramic powder added to impart electrical insulation to the functionally graded composite material obtained by the manufacturing method, according to the present disclosure, may be made of oxide-based ceramic or non-oxide-based ceramic having electrical insulation.

As the oxide-based ceramic, the oxide may include $Al_2O_3$, $SiO_2$, $TiO_2$, $Y_2O_3$, $ZrO_2$, $Ta_2O_5$, $ThO_2$, $ZrSiO_2$ BeO, $CeO_2$, $Cr_2O_3$, $HfO_2$, $La_2O_3$, MgO, $Nb_2O_3$, and the like.

The non-oxide-based ceramic may be selected from nitride, carbide, and silicide, and the nitride may include at least one among AlN, GaN, InN, BN, $Be_3N_2$, $Cr_2N$, HfN, MoN, NbN, $Si_3N_4$, TaN, $Ta_2N$, $Th_2N_3$, TiN, $WN_2$, $W_2N$, VN, and ZrN, and the carbide may include at least one among B4C, $Cr_3C_2$, HfC, $LaC_2$, $Mo_2C$, $Nb_2C$, SiC, $Ta_2C$, $ThC_3$, TiC, $W_2C$, WC, $V_2C$, and ZrC, and the silicide may include at least one among $CrSi_2$, $Cr_2Si$, HfSi, $MoSi_2$, $NbSi_2$, $TaSi_2$, $Ta_5Si_3$, $ThSi_2$, $Ti_5Si_3$, $WSi_2$, $W_5Si_3$, $V_3Si$, and $ZrSi_2$.

In addition, the polymer powder added to impart electrical insulation to the functionally graded composite material obtained by the manufacturing method, according to the present disclosure, is made of a thermoplastic resin or a thermosetting resin.

Examples of thermoplastic resin may include polyethylene, polypropylene, and poly-4-methylpentene-1, which are olefin-based resins, polymethyl methacrylate, acrylonitrile, which are acrylic resins, and polyvinyl chloride, polyvinyl acetate, polyvinyl alcohol, polyvinyl butyral, polyvinylidene chloride, which are vinyl-based resins, polystyrene, ABS resin, which are styrene-based resin, ethylene tetrafluoride resin, ethylene trifluoride resin, polyvinylidene fluoride, polyvinyl fluoride, which are fluorine-based resin, and nitrocellulose, cellulose acetate, ethyl cellulose, propylene cellulose, etc., which are cellulose-based resin. resins are mentioned. In addition, polyamide, polyamideimide, polyacetal, polycarbonate, polyethylene butyrate, polybutylene butyrate, ionomer resin, polysulfone, polyether sulfone, polyphenylene ether, polyphenylene sulfide, polyether imide, polyether ether ketone, aromatic polyester (econol, polyarylate), and the like, can be used as a thermoplastic resin.

In addition, examples of the thermosetting resin may include a phenol resin, an epoxy resin, and a polyimide resin.

The composition of the mixed powder prepared in step (a) is not particularly limited, and the mixing ratio of metal and ceramic or polymer can be selected in consideration of the physical properties required for the finally manufactured functionally graded composite material for PCB. Preferably, the composition of the mixed powder may be a mixed powder in which i) 30 to 85% by volume of a metal powder, including a powder made of aluminum or an aluminum alloy and a magnesium powder and ii) 15 to 70% by volume of a polymer or ceramic powder are uniformly mixed.

Next, in step (b), at least two kinds of mixed powders prepared in step (a) are laminated to form a functionally graded laminate having different polymer or ceramic powder contents with respect to the metal powder content of each layer from the lowermost layer is directed toward the uppermost layer.

For example, step (b) may be performed through a method of sequentially filling a mold with each mixed powder having a different polymer or ceramic powder content compared to the metal powder content prepared in step (a), but is not limited by the method. Any method may be used as long as it is a method capable of manufacturing a functionally graded laminate, including at least two layers having different polymer or ceramic powder contents with respect to the content of the metal powder.

Next, in step (c), the functionally graded laminate prepared in step (b) is sintered at atmospheric pressure or by spark plasma sintering to prepare a functionally graded composite material for PCB.

In performing atmospheric sintering in this step, sintering conditions such as sintering temperature and sintering time may be appropriately selected in consideration of the type and content of metal powder and polymer or ceramic powder contained in the mixed powder, particle size, and microstructure control for a PCB.

For example, in the case of manufacturing a composite material by pressureless sintering of a functionally graded laminate obtained by laminating a mixed powder including a metal powder made of aluminum or aluminum alloy and a magnesium powder and a polymer powder, it is preferable to carry out atmospheric sintering for 1 to 6 hours at a temperature range of 300° C. or higher and less than 400° C.

At this time, if the sintering temperature is less than 300° C., sintering is not performed sufficiently, and if the sintering temperature is 400° C. or more, it is difficult to control the shape of the composite material due to the melting of the polymer. In addition, if the sintering time is less than 1 hour, it is difficult to achieve sufficient sintering, and if it exceeds 6 hours, it is not preferable in terms of economic efficiency of the manufacturing process.

Regarding the sintering temperature, as described above, after determining arbitrary temperatures T1 and T2 (provided that T1<T2) belonging to the selected sintering temperature range in consideration of the type and content of raw powder, etc., it may be carried out while gradually increasing for the sintering time from T1 to T2, or while maintaining the sintering time at a predetermined temperature within the sintering temperature range. When the sintering is performed at a predetermined temperature, only one temperature level may be maintained, a plurality of temperature levels may be maintained, and in this case, when the sintering is maintained at a plurality of temperature levels, the maintenance time at each temperature level may be the same or different.

Spark plasma sintering, which is another means for manufacturing the functionally graded composite material in the sintering step, applies a direct current to the functionally graded laminate under the condition that pressure is applied, and then the spark discharge phenomenon occurs due to the pulsed phase direct current flowing between the particles of the mixed powder contained in each layer of the composite. Accordingly, the mixed powder is sintered by thermal diffusion and electric field diffusion due to the high energy of instantaneous discharge plasma and heat generation due to electric resistance of mold and the applied pressure and electrical energy, and metal and ceramic or polymer are combined in a short time to manufacture a composite material having a dense structure. This sintering ability allows the growth of composite material particles to be effectively controlled, and the functionally graded composite material for PCB with a uniform microstructure can be manufactured.

In the present disclosure, the spark plasma sintering process may be performed by a spark plasma sintering device. The device may include: for example, a chamber provided with an upper electrode and a lower electrode to generate discharge plasma by supplying current, thereby forming a space for accommodating a mold capable of sintering a functionally graded laminate; a cooling unit capable of cooling the chamber by circulating coolant; a current supply unit for supplying current to the upper and lower electrodes; temperature sensing unit capable of detecting temperature in the chamber above; a pump capable of discharging internal air from the inside of the chamber to the outside; a pressure supply unit capable of supplying pressure to the inside of the chamber; a control unit that controls the temperature of the spark plasma sintering process according to the temperature sensed by the temperature sensing unit; and an operation unit capable of controlling the control unit.

In this step, in order to spark plasma sintering the functionally graded laminate, the spark plasma sintering process can be performed by using a pump provided in the discharge plasma device to remove impurities in the gas phase existing in the chamber and to prevent oxidation by evacuating and depressurizing the chamber until the inside of the chamber is in a vacuum state.

In addition, after pre-heating the mixed powder by heating the mixed powder to a sintering temperature at a predetermined temperature increase rate, spark plasma sintering can be performed, and by pre-heating the mixed powder at the temperature increase rate as described above, a uniform temperature inside and outside the mixed powder is supplied through the spark plasma sintering process, thereby forming a functionally graded composite material for a PCB having a uniform structure.

In addition, the spark plasma sintering process can suppress the growth of particles constituting the composite material by controlling the temperature increase rate, thereby controlling the size of the manufactured functionally graded composite material for PCB.

For example, in the case of manufacturing a composite material using a mixed powder including a metal powder made of aluminum or an aluminum alloy and a magnesium powder and a polymer powder, the spark plasma sintering process may be performed at a temperature of 200° C. to 400° C. and a pressure of 5 to 100 MPa for 1 to 10 minutes to manufacture a functionally graded composite material for a PCB.

In addition, in this step, after sintering the functionally graded composite material for PCB as described above, the step of cooling the composite material may be additionally included, and a functionally graded composite material for PCB having excellent mechanical properties can be obtained through this step. In this step, it is possible to suppress the formation of voids formed on the surface and inside of the composite material by cooling the composite material under the condition of maintaining a constant pressure.

The method for manufacturing a functionally graded composite material for PCB, according to the present disclosure described above, by manufacturing a heterogeneous composite functionally graded material through a sintering process using powder metallurgy such as pressureless sintering and spark plasma sintering after forming a functionally graded composite by laminating a metal powder containing aluminum and magnesium and a mixed powder containing an electrically insulating polymer and/or ceramic powder, it is possible to obtain a material for PCB that has high heat dissipation and electrical insulation at the same time due to the excellent thermal conductivity of the metal matrix and the electrical shielding ability by the introduction of insulating particles. In addition, according to the present disclosure, a process for raising an insulating layer required for manufacturing a metal-based PCB may be excluded, and a problem of degradation in thermal conductivity of the PCB caused by the insulating layer manufacturing process may be solved, and thus may be applied as various substrate materials.

MODE FOR DISCLOSURE

Hereinafter, the present disclosure will be described in more detail by way of examples.

Embodiments according to the present specification may be modified in various other forms, and the scope of the present specification is not to be construed as being limited to the embodiments described below. The embodiments of the present specification are provided to more completely explain the present specification to those of ordinary skilled in the art.

EXAMPLE

In this embodiment, a functionally graded laminate was prepared with a mixed powder obtained by mixing a metal powder including aluminum powder and magnesium powder, and a polymer powder, and the functionally graded composite material for PCB was manufactured by pressureless sintering or spark plasma sintering.

The metal powder used in this example was an aluminum-magnesium composite material (AlSium) powder containing 50% by volume each of aluminum powder and magnesium powder, and as the polymer powder, a powder made of a polyarylate (PAR) resin was used.

For reference, a polyarylate resin refers to an aromatic linear polyester resin and is a plastic engineering resin having special physical properties, and has high heat resistance, excellent mechanical strength, and transparent, and thus is used in switches, sockets, microwave components, relay cases, and substrates. In addition, in the mechanical field, it is widely used as various materials and packaging materials such as in-watches/outdoors, optical-mechanical components, gas breakers, etc., or lenses in housing or automotive fields, electrical equipment housing, instrument panels, etc. The polyarylate resin, as described above, is usually prepared by polycondensation of an aromatic diol and an aromatic dicarboxylic acid.

First, the volume ratio of AlSium powder and PAR powder was changed to 85:15, 80:20, 75:25, 70:30, 65:35, respectively, and charged into a stainless steel vial of a ball milling device, and 20 ml of heptane was added. A ball is inserted by setting a weight ratio of the stainless steel-based ball (diameter 10 mm) and the mixed powder to 5:1, and a low energy ball milling process is performed at 160 rpm for 24 hours to perform a polymer or ceramic powder content fraction with respect to the metal powder content (AlSium-15 vol. % PAR, AlSium-20 vol. % PAR, AlSium-25 vol. % PAR, AlSium-30 vol. % PAR, AlSium-35 vol. % PAR) was prepared.

Then, each of the five types of metal/polymer mixed powder was sequentially laminated on a mold to prepare a functionally graded laminate, and then a functionally graded composite material for PCB was prepared through pressureless sintering or spark plasma sintering.

In the case of manufacturing a composite material through atmospheric sintering, the functionally graded laminate is pressed at a pressure of 250 MPa to prepare a molded body and then sintered under atmospheric pressure under the conditions of a temperature increase rate of 5° C./min., a sintering temperature of 350° C., and a sintering time of 1 hour. In the case of manufacturing a composite material through spark plasma sintering, the functionally graded laminate is charged into a cemented carbide (WC-Co) mold coated with boron nitride (BN) and then performed the spark plasma sintering process at a temperature increase rate of 50° C./min, a sintering temperature of 300° C., a sintering time of 3 minutes, and a sintering pressure of 40 Mpa to prepare the functionally graded composite material for PCB.

Although the embodiment of the present disclosure has been described with reference to the accompanying drawings, it will be understood by those skilled in the art that the present disclosure may be implemented in other specific forms without changing the technical spirit or essential features thereof. Therefore, it should be understood that the embodiments described above are illustrative in all respects and not restrictive.

INDUSTRIAL APPLICABILITY

According to the method for manufacturing a functionally graded composite material for PCB according to the present disclosure, it is possible to obtain a PCB material having both high heat dissipation and electrical insulation properties due to the excellent thermal conductivity of the metal matrix and the electrical shielding ability due to the introduction of insulating particles. In addition, a process for increasing an insulating layer required for manufacturing a metal-based PCB according to the related art may be excluded, and a problem of degradation of thermal conductivity of the PCB caused by the insulating layer manufacturing process may be solved.

What is claimed is:

1. A method for manufacturing a functionally graded composite material for a printed circuit board (PCB), the method comprising:
    preparing two or more types of mixed powders with different contents of polyarylate (PAR) powder, each mixed powder comprising (i) 30% to 85% by volume of a metal powder comprising a powder made of aluminum or an aluminum alloy and a powder of magnesium and (ii) 15% to 70% by volume of polyarylate (PAR) powder;
    laminating the two or more types of mixed powders to form a functionally graded laminate in which a ratio of the content of the polyarylate (PAR) powder to the content of the metal powder in each of layers stacked in sequence from bottom to the top of the laminate differs; and
    preparing a functionally graded composite material by sintering the functionally graded laminate by pressureless sintering or spark plasma sintering.

2. The method of claim 1, wherein in the functionally graded laminate, the ratio of the content of the polyarylate (PAR) powder to the content of the metal powder in each layer increases from bottom to top.

3. The method of claim 1, wherein in the functionally graded laminate, the ratio of the content of the polyarylate (PAR) powder to the content of the metal powder in each layer decreases from bottom to top.

* * * * *